United States Patent [19]

Liu et al.

[11] Patent Number: 5,429,990
[45] Date of Patent: Jul. 4, 1995

[54] SPIN-ON-GLASS PLANARIZATION PROCESS WITH ION IMPLANTATION

[75] Inventors: Ming-Tsung Liu, Hsin-chu; Jeffrey Wang, Chang-fa; Wen Yang Chen; D. Y. Wu, both of Hsin-chu, all of Taiwan

[73] Assignee: United Microelectronics Corporation, Hsinchu, Taiwan

[21] Appl. No.: 224,701

[22] Filed: Apr. 8, 1994

[51] Int. Cl.⁶ .......................................... H01L 21/316
[52] U.S. Cl. .................... 437/190; 437/231; 437/238
[58] Field of Search ............... 437/225, 228, 190, 195, 437/231, 238

[56] References Cited

U.S. PATENT DOCUMENTS

| | | | |
|---|---|---|---|
| 4,676,867 | 6/1987 | Elkins et al. | 156/643 |
| 4,775,550 | 10/1988 | Chu et al. | 427/38 |
| 4,885,262 | 12/1989 | Ting et al. | 437/231 |
| 5,003,062 | 3/1991 | Yen | 437/231 |
| 5,192,697 | 3/1993 | Leong | 437/37 |

OTHER PUBLICATIONS

Moriya, Modification Effects in Ion–Implanted $SiO_2$ Spin–on–glass, J. Electrochem., Soc., vol. 140, No. 5, May 1993, pp. 1442–1449.

*Primary Examiner*—R. Bruce Breneman
*Attorney, Agent, or Firm*—George O. Saile

[57] ABSTRACT

A new method of planarizing an integrated circuit is achieved. The dielectric layers between the conductive layers of an integrated circuit are formed and planarized via A first silicon oxide layer is deposited over the metal layer. This is covered with a spin-on-glass layer. This layer is dried by baking. The spin-on-glass layer is now fully cured. The cured spin-on-glass layer is now ion implanted under the conditions of between about 1E15 to 1E17 atoms/$cm^2$ and energy between about 50 to 100 KeV. A silicon oxide layer is deposited thereover. Via openings are now made through the silicon oxide layers and the spin-on-glass layer and filled with metal. This results in excellent planarity with no poisoned via problems. Most importantly, this method can be used for submicron technologies having conductor lines which are spaced from one another by submicron feature size and can be processed without the use of an etch-back process for the cured spin on and glass layer.

14 Claims, 2 Drawing Sheets

SPIN-ON-GLASS PLANARIZATION PROCESS WITH ION IMPLANTATION

BACKGROUND OF THE INVENTION (1) Field of the Invention

The invention relates to a method of planarizing an integrated circuit device, and more particularly, to a method of planarizing a submicron integrated circuit device using spin-on-glass wherein the spin-on-glass layer is thermally cured and then ion implanted to improve the outgassing characteristics of the layer.

(2) Description of the Prior Art

In conventional planarization of the metallurgy-dielectric layers of an integrated circuit, a metal is deposited and patterned by conventional lithography and etching techniques. Then the dielectric layer, which is typically silicon oxide material, is formed thereover. The dielectric layer may now be etched back to planarize the metallurgy-dielectric layers. There are basic problems in the choice of thickness of the dielectric layer. The problems occur particularly where there are substantially different heights on the surfaces of the integrated circuit, particularly in the formation of memory word lines and the like in memory products. For example, in the areas where contact is planned to be made to the patterned metal, it is desired to have a thick dielectric layer to keep planarity, but the thick dielectric will cause voids in other areas. Alternatively, if a thin dielectric layer is used, there is lost planarity in the contact area and etchback encroachment of the metal pattern, but there will not be a void problem in other surface areas of the integrated circuit. There is not a good solution for this planarity versus void surface problem in the art.

The spin-on-glass materials have been used for planarization of integrated circuits. The material to be applied is thoroughly mixed in a suitable solvent. The spin-on-glass material suspended in the vehicle or solvent is deposited onto the semiconductor wafer surface and uniformly spread thereover by the action of spinning the wafer. The material fills the indentations in the integrated circuit wafer surface, that is planarization. Most of the vehicle or solvent is driven off by a low temperature baking step often followed by vacuum degassing. Other coatings of the spin-on-glass material are applied, baked and vacuum degassed until the desired spin-on-glass layer is formed.

The final step in the making of the spin-on-glass layer is curing. Curing is a high temperature heating step to cause the breakdown of the silicate or siloxane material to a silicon dioxide like cross linked material.

In the conventional sandwich process, a conformal oxide is first deposited followed by a coating of spin-on-glass material. This is cured at about 425° C. to become a silicon dioxide layer with some other materials, such as organics depending upon the particular spin-on-glass material that is used. The final oxide of the sandwich is deposited.

In general, there are two kinds of spin-on-glass planarization. One uses etchback and the other does not use etchback. The etchback process uses an etching back step to remove the spin-on-glass layer which will exist in the via holes. Its advantage is to protect the via hole from moisture or other gases absorbed in the cured spin-on-glass which may damage the via stepcoverage or metallurgy. The disadvantages for this etchback process are (1) this process needs an extra etchback step and (2) it is difficult to keep the etching selectivity of spin-on-glass to silicon oxide so that there could be produced a poorer planarization that expected. With the non-etchback process, it is easy to cause a poisoned via. During the deposition of the metallurgy, moisture and other gases can be released from the spin-on-glass layer in its sidewall regions to react with the metallurgy to cause the so-called poisoned via. This will cause poor metal stepcoverage or even an metallurgy and electrical open in the via.

A number of patents have addressed these and other problems in spin-on-glass planarization. U.S. Pat. No. 5,003,062 to Yen involves a sandwich process in which the spin-on-glass material can be either silicate or siloxane. A vacuum degassing step is used. In U.S. Pat. No. 4,775,550 to Chu et al, the first insulating layer is very thick, on the order of 8000 to 10,000 Angstroms. This thickness causes voids in the submicron area. The aforementioned patent to Chu et al as well as U.S. Pat. Nos. 4,676,867 to Elkins et al and 4,885,262 to Ting et al each show spin-on-glass etchback processes with use of a sandwich dielectric.

The Joe H. K. Leong U.S. Pat. No. 5,192,697 describes an alternative curing method to that of the thermal curing method. His method involves the use of ion implantation to cause heating within the spin-on-glass layer to cause curing of the layer. "Modification Effects in Ion-Implanted $SiO_2$ Spin on Glass" by N. Moriya et al in J. Electrochem, Soc. Vol, No 5 May 1993, pp 1442–1449 describes the physical effects caused by ion implanting into silicate and siloxane spin-on-glass layers formed on silicon wafers.

SUMMARY OF THE INVENTION

Another object of the present invention is to provide a method of planarizing an integrated circuit which does not result in the metallurgy problem of poisoned via.

A principal object of the present invention is to provide an effective and very manufacturable method of planarizing a submicron integrated circuit using spin-on-glass that does not use an etchback step and still does not have the poisoned via problem.

Yet another object of the present invention is to provide a method of planarizing an integrated circuit which does not result in voids between devices due to poisoned via problems.

In accordance with the objects of this invention a new method of planarizing an integrated circuit is achieved. The dielectric layers between the conductive layers of an integrated circuit are formed and planarized via A first silicon oxide layer is deposited over the metal layer. This is covered with a spin-on-glass layer. This layer is dried by baking. The spin-on-glass layer is now fully cured. The cured spin-on-glass layer is now ion implanted under the conditions of between about 1E15 to 1E17 atoms/$cm^2$ and energy between about 50 to 100 KEV. A silicon oxide layer is deposited thereover. Via openings are now made through the silicon oxide layers and the spin-on-glass layer and filled with metal. This results in excellent planarity with no poisoned via problems. Most importantly, this method can be used for submicron technologies having conductor lines which are spaced from one another by submicron feature size and can be processed without the use of an etch-back process for the cured spin on and glass layer.

BRIEF DESCRIPTION OF THE DRAWINGS

In the accompanying drawings forming a material part of this description, there is shown.

DESCRIPTION OF THE PREFERRED EMBODIMENTS

Figure 1:
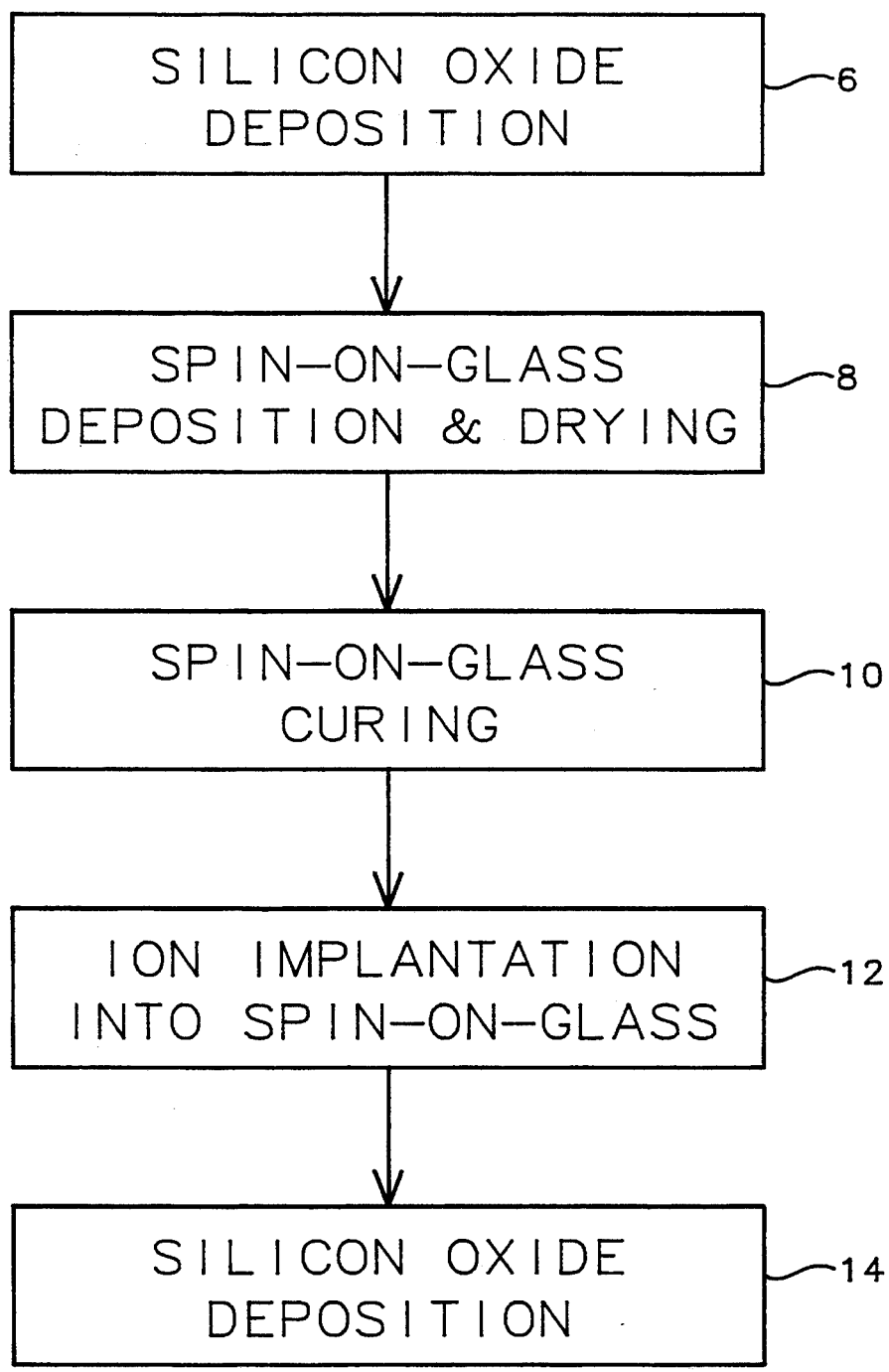
FIG. 1 shows the method for forming the spin-on-glass intermetal dielectric having the reduced outgasing problem of the invention.

Referring now to FIG. 1 there is shown the process outline of the formation of the intermetal dielectric layer according to the present invention. The intermetal dielectric layer can be formed between the contact metallurgy and the first level metallurgy, between the first level and second level metallurgies or between successive metal layers for an integrated circuit as will be understood in the art. The spin-on-glass planarization process is useful at all levels. The process begins by depositing a layer of silicon oxide over the conductive layer, such as a metal or a highly doped polysilicon layer as give in step 6. The spin-on-glass layer is deposited as given by step 8 by the usual spinning method.

Both siloxane and silicate spin-on-glass materials may be used in this method, but the siloxane type is preferred. The layer includes a vehicle or solvent which needs to be removed by a low temperature drying or baking step. This step is performed preferably by hot plate bake by moving the wafer through hot plate heating sequentially, at temperatures of 80° C., 150° C., and 200° C.

In step 10, the spin-on-glass is cured by a thermal process which includes a nitrogen atmosphere curing at 425° C. for about 40 or more minutes. In step 12, the critical ion implantation process is used, is not fully understood, but it is believed the process result that the spin-on-glass structure with its —OH, —CH$_3$ bonds are broken or reduced in many ways. The film density of the spin-on-glass layer increases and the quality of the layer will be very similar to that of chemical vacuum deposited silicon oxide in the sense that it does not have the problem of moisture absorption. Further the spin-on-glass layer will be stable and without moisture evolving in the sidewall region of the via holes. The last step 14 is to deposit the top silicon oxide layer over the spin-in-glass layer.

Figure 2:
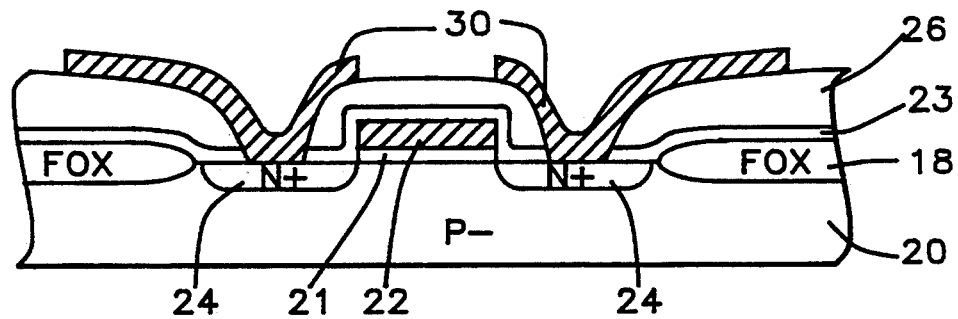
FIGS. 2 through 4 schematically illustrate in cross-sectional representation one preferred embodiment of this invention.
Figure 3:
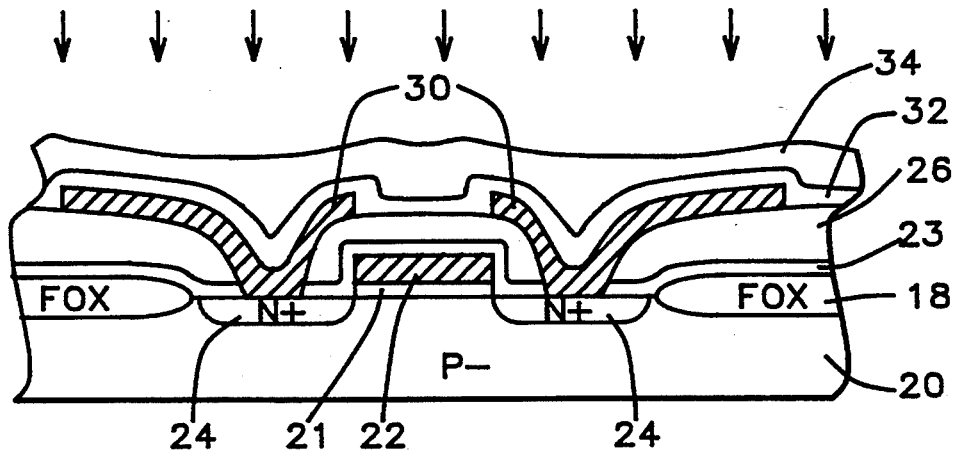
Figure 4:
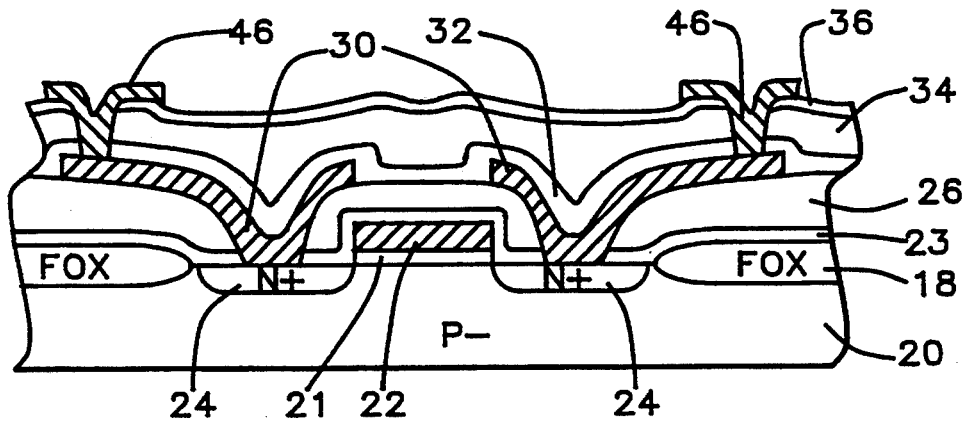

Referring now more particularly to FIGS. 2 through 4, there is shown a process which uses the FIG. 1 described intermetal dielectric layer in a metal oxide field effect transistor integrated circuit. FIG. 2 is an illustration of a partially completed, single N channel metal oxide field effect transistor (MOSFET). The first series of steps involve the formation of the dielectric isolation regions for isolating semiconductor surface regions from other such regions in the semiconductor substrate 20. The semiconductor substrate is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 18. Then semiconductor devices can be provided in the silicon mesas according to the following processes.

The surface of the silicon substrate 20 is thermally oxidized to form the desired gate oxide 21 thickness. The preferred thickness is between about 70 to 200 Angstroms. The polysilicon layer 22 is blanket deposited by LPCVD (Low Pressure Chemical Vapor Deposition) method to a conventional thickness. The polysilicon layer 22 is ion implanted with phosphorous or arsenic ions by conventional methods and dosages to render the polysilicon layer conductive or doped with phosphorus oxychloride at a temperature about 900° C. The surface of the layer is either thermally oxidized or a chemical vapor deposition process to form silicon oxide layer 23. The layers 21, 22 and 23 are patterned by conventional lithography and anisotropic etching techniques as are conventional in the art to provide a desired pattern of gate electrodes and structure on the FOX 18 surfaces or elsewhere as seen in FIG. 2.

The source/drain structure of the MOS FET may now be formed by conventional methods. FIG. 2 shows an N channel MOSFET integrated circuit device wherein the substrate or well is doped as P−. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate.

FIG. 2, for example shows the device regions, typically source/drain regions 24 in the substrate as of N+ dopants. The N+ regions may be formed by ion implantation as is well known in the art.

A passivation or insulating layer 26 is now formed over the surfaces of the patterns. This layer may be composed of multilayers such as a thin layer of silicon oxide and a much thicker layer of borophosphosilicate glass, phosphosilicate glass or similar insulating layer. The operational thicknesses of these layers are between about 1000 to 2000 Angstroms for the oxide layer and between about 5000 to 6000 or more Angstroms for the glasseous layer. These layers are typically deposited by chemical vapor deposition in low pressure or atmospheric pressure, or in a plasma enhanced reactive chamber.

The contact windows are openings are formed through the insulating structure to the source/drain regions 24. Conventional lithography and etching techniques are used to form this pattern of openings.

The first metallurgy contact layer 30 is now deposited over the surface of the structure and within the pattern of contact openings. The metallurgy is preferably Al/Si/Cu W-Ti (Aluminum/Silicon/Copper Tungsten-Titanium) barrier having a thickness of between about 5K to 7K Angstroms. However, other possible metallurgy include Aluminum-Silicon, dual-doped polysilicon, Titanium Silicide, Titanium:Tungsten, Titanium Nitride and Chemical Vapor Deposition Tungsten and polycides. The metallurgy may be deposited by dc magnetron sputtering. The metallurgy is now patterned into the desired conductive lines by conventional lithography and etching techniques to form the pattern of metal layer 30 in FIG. 2.

Referring now more particularly to FIG. 3, the usual first dielectric silicon oxide layer 32 of the spin-on-glass sandwich planarization structure is now formed by PECVD (plasma enhanced chemical vapor deposition) process above the first metallurgy pattern 30. It is typically in the range of between about 2000 to 5000 Angstroms in thickness. This is followed by the creation of the spin-on-glass layer 34. The spin-on-glass material suspended in the vehicle or solvent is deposited onto the semiconductor wafer surface and uniformly spread thereover by the action of spinning the wafer. The material fills the indentations in the integrated circuit wafer surface, that is planarization. Most of the vehicle or solvent is driven off by a low temperature baking step. Typically, successive hot plate baking at 0° C., 150° C. and 200° C. for one minute at each hot plate step. Typically, a double coat of the spin-on-glass material is applied. The material can be either silicate or siloxane. However, siloxane is preferred. Each coat is 500 to 1500 Angstroms thick for a total thickness of 1000 to 3000 Angstroms.

After the spin-on-glass (SOG) layer has been completed, the layer 34 is cured by the thermal curing method. The method improves curing of the layer at about 425° C. in a nitrogen atmosphere for 40 or more minutes.

The Ion implantation is done preferably within an ion implantation chamber. The wafer or wafers are set upon a pedestal within the chamber. The wafer temperature at maintained between about 25° to 100° C. Ions, preferably phosphorus (P31) or arsenic ($As^{75}$) are implanted into the thermally cured spin-on-glass layer 34 at a preferred dose of between 1E15 and 1E17 ions/cm$^2$ and energy of 50 to 100 KeV for a thickness of about 1500 Angstroms of Siloxane type material, such as Allied Signal III which is a siloxane type SOG. Note that more than 1E17 up to 1E18 for example, could be used, but of course it takes more machine time. The preferred implant time is between about 10 to 30 minutes under these conditions, depending upon dosage so if 1E18 is used, the time could be about 60 minutes. Since the implantation is done within a vacuum chamber, the gases trapped within the wafer are pulled out by the vacuum. The action of the ions moving through the spin-on-glass layer causes the decrease of moisture absorption into the resulting SOG layer. We believe that the effect of the ion under these process conditions is to break or rearrange the bonds, for example —OH, —CH$_3$ and the like which are radicals which absorb the moisture in an untreated SOG layer. FIG. 5 shows this effect. FTIR (fast time infrared) microscopy for OH moisture absorption rate at 3380 cm$^{-1}$ for P$_{31}$ ion implant is about 0.013. However, without ion implant the moisture absorption rate is about 0.04.

FIG. 4 illustrates the deposition of a second layer of silicon dioxide 36. This second layer should be deposited as soon as possible after the ion implantation treating step to cap the spin-on-glass layer from the atmosphere. Openings are made through the spin-on-glass sandwich 32, 34, 36 using conventional lithography and etching techniques. Contact is made to the first metal layer 30 by a second metal layer 46 which is deposited into the opening. The metal layer 46 is patterned by conventional lithography and etching techniques to complete construction of the desired FET structure shown in this FIG. 4. It is of course understood by those skilled in the art that further layers of spin-on-glass sandwich can be formed to allow further metallurgy to be applied over the structure.

EXAMPLES 1-3

Siloxane (Allied Signal III) spin-on-glass layers of uniform thicknesses were deposited on three wafers. Each of these wafers having the spin-on-glass layer thereon were hot plate baked for one minute duration at temperatures of 80° C., 150° C. and 200° C. The spin-on-glass layer was cured by loading the wafers into a vacuum furnace at 250° C. and the furnace was ramped up to 425° C. in 12 minutes and stabilized for 35 minutes. Curing was done in a nitrogen atmosphere for 40 minutes and then the wafers were removed from the furnace after the furnace was returned to atmospheric pressure. After cool down to room temperature, the wafers were treated or not treated by ion implantation under vacuum conditions and between 25° C. and 100° C. as given in the following:

| Example | Ion | KEV | Dosage | Time |
|---|---|---|---|---|
| 1 | No I/I | — | — | — |
| 2 | BF$_2$ | 80 | 2E15 | 30 minutes |
| 3 | P$_{31}$ | 50 | 2E15 | 30 minutes |

EXAMPLES 4-8

Siloxane spin-on-glass layers of uniform thickness were deposited on separate wafers having a PECVD silicon oxide layer, baked, cured and cooled as described in Examples 1-3, above. The wafers with spin-on-glass layers were etch-back to leave the curved spin-on-glass only within indentations of surface or not etch-back and treated or not treated by ion implantation as given in the Following:

| Example | Etch-back | Ion | KEV | Dosage | Yield % | Via Resistivity ohm/via |
|---|---|---|---|---|---|---|
| 4 | No | P$_{31}$ | 50 | 1E16 | 84.2 | 0.319 |
| 5 | No | P$_{31}$ | 50 | 1E16 | 86.8 | 0.319 |
| 6 | No | As$^{75}$ | 80 | 5E15 | 85.7 | 0.301 |
| 7 | No | No | — | — | 73.2 | 0.334 |
| 8 | Yes | No | — | — | 87.1 | 0.306 |

The results show that spin-on-glass with ion implantation treatment improves the yield % and via resistivity of the spin-on-glass without the requirement of an extra etch-back step as seen in the Examples. The spin-on-glass without the etch-back and without ion implantation treatment (Example 7) is not as good as seen by yield % and via resistivity. The Examples 4, 5 and 6 show the advantage of not using etch-back and using ion implantation treatment after spin-on-glass curing.

EXAMPLES 9-13

Those Examples were made according to the process described with regard to Examples 4-8 with the addition of a PECVD silicon oxide layer deposited over the cured and treated by ion implantation or not treated as indicated as follows:

| Example | Etch-back | Ion | KEV | Dosage | Yield |
|---|---|---|---|---|---|
| 9 | No | P$_{31}$ | 50 | 1E15 | 87.1 |
| 10 | No | P$_{31}$ | 80 | 1E15 | 88.2 |
| 11 | Yes | — | — | — | 86.4 |

| Example | Etch-back | Ion | KEV | Dosage | Yield |
|---|---|---|---|---|---|
| 12 | No | $P_{31}$ | 50 | 2E15 | 88.0 |
| 13 | No | $As^{75}$ | 80 | 1E15 | 87.0 |

The Examples which used the ion implantation treatment of cured spin-on-glass which had not been etchback and had a PECVD silicon oxide capping layer formed thereover had as good a yield as the spin-on-glass etch-back Example 11 which was not treated by ion implantation.

While the invention has been particularly shown and described with reference to the preferred embodiments thereof, it will be understood by those skilled in the art that various changes in form and details may be made without departing from the spirit and scope of the invention.

What is claimed is:

1. The method of providing a high quality spin-on-glass layer of a planarized MOSFET multilayered metal structure having no poisoned via problem and without the use of etch-back of the spin-on-glass layer comprising:

providing a MOSFET semiconductor structure in and on a semiconductor substrate;
   providing conductive layers for contacting the active elements of said MOSFET structure;
   providing a layer of an insulator over said conductive layers and a spin-on-glass layer over said layer of an insulator;
   curing said spin-on-glass layer using heat;
   treating the cured said spin-on-glass by ion implantation of phosphorus ions into said cured spin-on-glass layer;
   the said ions are of sufficient dosage and energy that the action of said ions moving through the complete thickness of said spin-on-glass layer to cause changes in said spin-on-glass which result in said high quality and freedom from said poisoned via problem;
   forming a insulator layer over said treated spin-on-glass layer;
   forming openings through said insulator layers and said treated spin-on-glass layer to said conductive layer; and
   depositing a second conductive layer into said openings to make contact to said conductive layer to complete said planarized MOSFET multilayer metal structure.

2. The method of claim 1 wherein the dose of said phosphorus ion implant is between 1E15 and 1E17 ions/cm$^2$ and the said thermally curing is done at a temperature of between about 400° to 430 ° C.

3. The method of claim 1 wherein the energy of said ion implant is between 50 and 100 KeV.

4. The method of claim 1 wherein said ion implantation is done within a chamber having a vacuum.

5. The method of providing a high quality spin-on-glass layer of a planarized MOSFET multilayered metal structure having no poisoned via problem and without the use of etch-back of the spin-on-glass layer comprising:

providing a MOSFET semiconductor structure in and on a semiconductor substrate;
   providing conductive layers for contacting the active elements of said MOSFET structure;
   providing a layer of an insulator over said conductive layers and a spin-on-glass layer over said layer of an insulator;
   curing said spin-on-glass layer using heat;
   treating the cured said spin-on-glass by ion implantation of arsenic ions into said cured spin-on-glass layer;
   the said ions are of sufficient dosage and energy that the action of said ions moving through the complete thickness of said spin-on-glass layer to cause changes in said spin-on-glass which result in said high quality and freedom from said poisoned via problem;
   forming a insulator layer over said treated spin-on-glass layer;
   forming openings through said insulator layers and said treated spin-on-glass layer to said conductive layer; and
   depositing a second conductive layer into said openings to make contact to said conductive layer to complete said planarized MOSFET multilayer metal structure.

6. The method of claim 5 wherein the dose of said Arsenic implant is between 1E15 and 1E17 ions/cm$^2$ and the said thermally curing is done at a temperature of between about 400° to 430° C.

7. The method of claim 6 wherein the energy of said Arsenic ion implant is between 50 and 100 KeV.

8. The method of claim 5 wherein said spin-on-glass layer is composed at least in part of siloxane material.

9. The method of providing a high quality spin-on-glass layer of a planarized MOSFET multilayered metal structure having no poisoned via problem and without the use of etch-back of the spin-on-glass layer comprising:

providing a MOSFET semiconductor structure in and on a semiconductor substrate;
   providing conductive layers for contacting the active elements of said MOSFET structure;
   providing a layer of an insulator over said conductive layers and a spin-on-glass layer over said layer of an insulator;
   curing said spin-on-glass layer using heat between about 400° to 430° C.;
   treating the cured said spin-on-glass by ion implantation of ions into said cured spin-on-glass layer;
   the said ions are of sufficient dosage and energy that the action of said ions moving through the complete thickness of said spin-on-glass layer to cause changes which result in said high quality and freedom from said poisoned via problem;
   forming a insulator layer over said treated spin-on-glass layer;
   forming openings through said insulator layers and said treated spin-on-glass layer to said conductive layer; and
   depositing a second conductive layer into said openings to make contact to said conductive layer to complete said planarized MOSFET multilayer metal structure.

10. The method of claim 9 wherein said ions are phosphorus and the dose of said ion implantation is between 1E15 and 1E17 ions/cm$^2$ and the energy between about 50 to 100 KeV.

11. The method of claim 9 wherein said ions are Arsenic and the dose of said ion implantation is between about 1E15 to 1E17 ions/cm$^2$ and the energy of said ion implantation is between 50 and 100 KeV.

12. The method of claim 9 wherein the thickness of each said spin-on-glass layer is between about 500 to 3000 Angstroms.

13. The method of claim 9 wherein the said spin-on-glass layer is composed at least in part of a silicate material.

14. The method of claim 9 wherein the said spin-on-glass layer is composed at least in part of a siloxane material.

* * * * *